United States Patent
Lynch et al.

(10) Patent No.: US 9,093,234 B2
(45) Date of Patent: Jul. 28, 2015

(54) ASSEMBLY OF A HANDHELD ELECTRONIC DEVICE

(75) Inventors: Stephen Brian Lynch, Portola Valley, CA (US); Pinida Jan Moolsintong, San Francisco, CA (US); Leng Lim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 393 days.

(21) Appl. No.: 13/544,812

(22) Filed: Jul. 9, 2012

(65) Prior Publication Data

US 2012/0281346 A1  Nov. 8, 2012

Related U.S. Application Data

(63) Continuation of application No. 12/204,610, filed on Sep. 4, 2008, now Pat. No. 8,218,306.

(60) Provisional application No. 60/967,575, filed on Sep. 4, 2007.

(51) Int. Cl.
| | |
|---|---|
| *G06F 1/16* | (2006.01) |
| *H01H 15/10* | (2006.01) |
| *H01H 9/02* | (2006.01) |
| *H05K 5/00* | (2006.01) |

(52) U.S. Cl.
CPC ............ *H01H 15/10* (2013.01); *H01H 9/0207* (2013.01); *H05K 5/0013* (2013.01); *Y10T 29/49995* (2015.01)

(58) Field of Classification Search
CPC ... G06F 1/1601; G06F 1/1607; G06F 1/1026; G06F 1/1056; H05K 7/00; H05K 7/10; G02F 1/133308
USPC .................................................. 361/679.34
See application file for complete search history.

(56) References Cited

U.S. PATENT DOCUMENTS

| | | | | |
|---|---|---|---|---|
| 4,681,987 | A | * | 7/1987 | Suwa ............................. 200/5 A |
| 5,808,707 | A | * | 9/1998 | Niibori et al. ................... 349/60 |
| 5,822,192 | A | | 10/1998 | Hayashi |
| 6,111,760 | A | | 8/2000 | Nixon |
| 6,323,846 | B1 | | 11/2001 | Westerman et al. |
| 6,490,016 | B1 | | 12/2002 | Koura |
| 6,532,152 | B1 | * | 3/2003 | White et al. ................... 361/692 |
| 6,560,092 | B2 | | 5/2003 | Itou et al. |
| 6,842,333 | B2 | * | 1/2005 | Lee et al. ................. 361/679.55 |
| 6,871,138 | B1 | | 3/2005 | Minelli |
| 6,888,591 | B2 | * | 5/2005 | Kim ............................... 349/58 |
| 7,210,963 | B2 | | 5/2007 | Chintala et al. |
| 7,214,892 | B2 | | 5/2007 | Williamson |
| 7,304,837 | B2 | | 12/2007 | Lo et al. |

(Continued)

*Primary Examiner* — Anthony Q Edwards
(74) *Attorney, Agent, or Firm* — Joseph F. Guihan

(57) ABSTRACT

Several mechanical features of an electronic device are provided. In some embodiments, the device may include a bezel coupled to a housing. One or more snaps of the bezel may be operative to engage a cantilever spring of the housing. In some embodiments, the device may include a window that is formed by coupling an outer layer to an inner layer that is larger than the outer layer. In some embodiments, the device may include a chassis for supporting the window. In some embodiments, the device may include a grounding clip for simultaneously grounding the bezel, the housing and a circuit board. In some embodiments, the device may include a switch that includes a button molded into a base using a double shot process. In some embodiments, the device may include a switch supporting bracket that includes a slot operative to receive a pin of the bezel.

14 Claims, 10 Drawing Sheets

(56) References Cited

U.S. PATENT DOCUMENTS

| | | |
|---|---|---|
| 7,315,417 B2 | 1/2008 | Chen et al. |
| 7,626,807 B2 | 12/2009 | Hsu |
| 7,633,747 B2 * | 12/2009 | Yang et al. ............... 361/679.3 |
| 7,688,574 B2 | 3/2010 | Zadesky et al. |
| 7,764,936 B2 | 7/2010 | Nakasono et al. |
| 7,827,341 B2 | 11/2010 | Riddiford et al. |
| 7,966,785 B2 | 6/2011 | Zadesky et al. |
| 8,014,142 B2 * | 9/2011 | Prest et al. ............... 361/679.3 |
| 2003/0046849 A1 | 3/2003 | Lin |
| 2003/0223187 A1 * | 12/2003 | Tsao et al. ............... 361/681 |
| 2004/0156168 A1 | 8/2004 | LeVasseur et al. |
| 2004/0182979 A1 * | 9/2004 | Krzoska et al. ............ 248/316.8 |
| 2004/0203518 A1 | 10/2004 | Zheng et al. |
| 2006/0087803 A1 | 4/2006 | Kim et al. |
| 2006/0250762 A1 | 11/2006 | Yang et al. |
| 2007/0052100 A1 | 3/2007 | Bellinger |
| 2007/0152983 A1 | 7/2007 | McKillop et al. |
| 2008/0037765 A1 | 2/2008 | Finney et al. |
| 2008/0316695 A1 | 12/2008 | Arends et al. |
| 2009/0141437 A1 | 6/2009 | Geiger et al. |
| 2010/0014232 A1 | 1/2010 | Nishimura |

\* cited by examiner

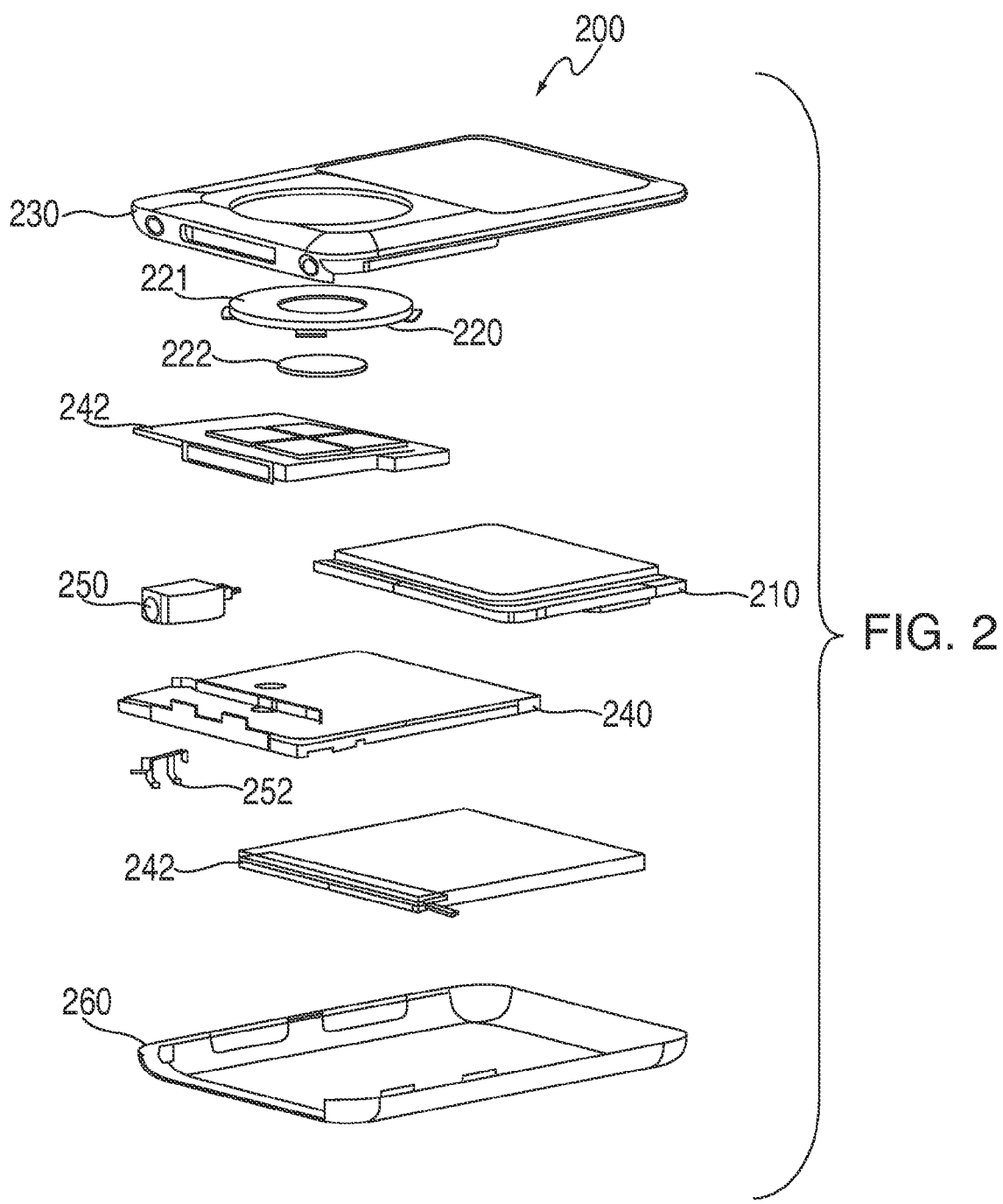

ASSEMBLY OF A HANDHELD ELECTRONIC DEVICE

CROSS-REFERENCE TO RELATED APPLICATION

This application is a continuation of U.S. patent application Ser. No. 12/204,610, filed Sep. 4, 2008 (now U.S. Pat. No. 8,218,306), which claims the benefit of U.S. Provisional Patent Application No. 60/967,575, filed Sep. 4, 2007, both of which are incorporated by reference herein in their entirety.

BACKGROUND OF THE INVENTION

This invention is directed to mechanical features of an electronic device case.

SUMMARY OF THE INVENTION

An electronic device case constructed from several components is provided. In some embodiments, the electronic device case may include a housing forming the bottom half of the case and a cantilever spring coupled to the inner surface of the housing such that the spring extends towards the opening of the housing, creating a channel between the spring and the housing wall. The spring may include an aperture. The case may also include a bezel having a post extending from the surface of the bezel. The post may include a snap that extends towards the inside of the case, the snap operative to engage the aperture of the spring when the bezel is placed over the housing and the post extends into the channel.

In some embodiments, the electronic device case may include an optical component for providing a display, and a window that includes an inner layer coupled to an outer layer, where the inner layer and outer layer are different components that are combined. A portion of the inner layer may extend beyond the outer layer to form a flange that may be used to couple the window to a bezel. The displays provided by the optical component may pass through the inner layer and appear on the outer layer.

In some embodiments, the electronic device case may include a chassis for supporting the window. The chassis may include a plate on which the window may rest, and at least two posts extending from the bottom surface of the plate, away from the plate. The posts may be coupled to the housing by a compliant member that is operative to deform in response to a force applied to the window to avoid bending the window.

In some embodiments, the electronic device case may include a grounding clip for grounding the bezel, the housing and a circuit board. The grounding clip may include a base and a spring extending from the base, where the spring contacts the housing. The grounding clip may also include a first connector extending from the base that contacts the bezel, and a second connector extending from the base that contacts the circuit board.

In some embodiments, the electronic device case may include a switch (e.g., a hold switch) operative to enable or disable an input mechanism. The switch may include a base that includes a first portion and a second portion that have different colors. The limit between the first and second portions may be substantially the middle of the base. The switch may include a button molded substantially in the middle of the base such that each of the first and second portion appear substantially only on one side of the button.

In some embodiments, the electronic device case may include a hold switch bracket for supporting the hold switch. The bracket may include a support operative to be coupled to the bezel. A protrusion operative to support the switch such that the switch is retained between the protrusion and the bezel may extend from the support. The bracket may include a slot operative to receive a pin incorporated in the bezel at a first end of the support, and a hole operative to be aligned with a hole in the bezel to receive a fastener at a second end of the support.

In some embodiments, the bezel may be manufactured using in part a forging process. The bezel may be formed by first blanking material, for example a sheet of aluminum. Forging operations may then be applied to the material to form the walls, top surface, and corners of the bezel. The material may then be machined to form holes and undercuts in the bezel (e.g., snaps in the bezel wall). Once machined, the material may be tumbled to provide an aesthetically pleasing finish.

BRIEF DESCRIPTION OF THE DRAWINGS

The above and other features of the present invention, its nature and various advantages will be more apparent upon consideration of the following detailed description, taken in conjunction with the accompanying drawings, and in which:

FIG. 2 is an exploded view of an electronic device case in accordance with one embodiment of the invention;

DETAILED DESCRIPTION

Figure 1A:
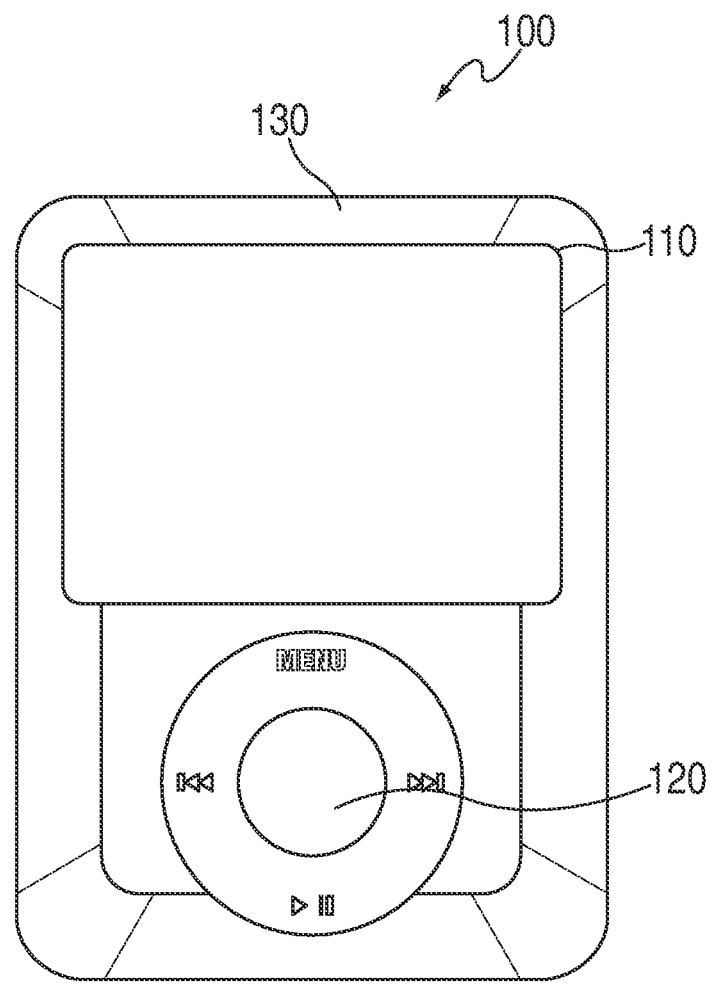
FIG. 1A is a front view of an illustrative electronic device case in accordance with one embodiment of the invention.

FIG. 1A is a front view of an illustrative electronic device in accordance with one embodiment of the invention. Device 100 may include any suitable type of electronic device, including for example a media player such as an iPod® available by Apple Inc., of Cupertino, Calif., a cellular telephone (e.g., an iPhone® available from Apple Inc.), a personal digital assistant, a desktop computer, a laptop computer, gaming console, set-top box, television system or television system component (e.g., a recording device), or any other suitable electronic device. Electronic device 100 may include window 110, input mechanism 120, and bezel 130. Window 110 may be any suitable screen or display for providing content to a user of the electronic device. For example, window 110 may include a glass, plastic (e.g., PMMA), composite, combinations thereof, or any other suitable material surface by which content may be displayed. In some embodiments, window 110 may include several layers coupled together (e.g., coupled together using an adhesive).

Input mechanism 120 may include any suitable input mechanism for providing inputs to the electronic device. For example, input mechanism 120 may include a wheel and several buttons (e.g., a click-wheel). In some embodiments, input mechanism 120 may be incorporated in window 110 as a touch-screen input mechanism/such as that described in U.S. Pat. No. 6,323,846, which is incorporated by reference herein in its entirety. The user interface may emulate a rotary phone or a multi-button keypad, which may be implemented on a touch screen or the combination of a click wheel or other user input device and a screen. A more detailed discussion of such a rotary phone interface may be found, for example, in U.S. patent application publication No. 2007/0152983, published on Jul. 5, 2007, which is incorporated by reference herein in its entirety.

Bezel 130 may form the upper outer surface of electronic device 100. Bezel 130 may include apertures for receiving window 110 and input mechanism 120, and may include features on the inner surface of bezel 130 for coupling each of window 110 and input mechanism 120 in bezel 130. In some embodiments, bezel 130 may include additional apertures for accessing connectors and input mechanisms. Bezel 130 may be coupled to housing 160 to form an enclosure (e.g., the case of electronic device 100) into which electronic device components may be placed. Bezel 130 may be coupled to housing 160 using any suitable approach, including using snaps as described in more detail below.

Figure 1B:
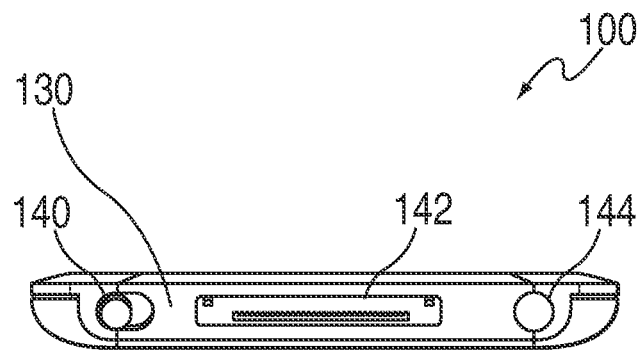
FIG. 1B is a bottom view of the electronic device case of FIG. 1A in accordance with one embodiment of the invention.

Bezel 130 may have any suitable shape. For example, bezel 130 may include a substantially flat top surface 131 from which vertical walls 132 may extend. Bezel 130 may include a curved edge along the interface between top surface 131 and vertical walls 132 having any suitable curvature, including for example a highly elongated sloping curve. The curvature of the edges may be selected based on any suitable criteria, including for example aesthetics or industrial design considerations. FIG. 1B is a bottom view of the electronic device case of FIG. 1A in accordance with one embodiment of the invention. As shown in FIG. 1B, bezel 130 may include apertures for accessing hold switch 140, connector 142, and jack plug 144.

FIG. 2 is an exploded view of an electronic device in accordance with one embodiment of the invention. Electronic device 200 may include bezel 230, input mechanism 220, and window 210, which may include some or all of the features described above in connection with electronic device 100 (FIG. 1). In some embodiments, input mechanism 220 may be include outer ring 221 and inner button 222 (e.g., to form a click-wheel).

Electronic device 200 may include chassis 240, which may be operative to support window 210 when electronic device 200 is assembled. Chassis 240, as described below in more detail, may include additional space below chassis 240 to house battery 242. In some embodiments, chassis 240 may extend beyond the periphery of window 210 and support circuit board 244, which may include the control circuitry, memory, and other components used to operate electronic device 200.

Electronic device 200 may include hold switch assembly 250, which may include a hold switch and a bracket, as described below in more detail. Electronic device 200 may include housing 260, which may be coupled to bezel 230 to form the outer surface of electronic device 200. Housing 260 may be constructed from any suitable material, and using any suitable approach. For example, housing 260 may be formed from aluminum or stainless steel (e.g., 304 series stainless steel), which may be then be finished (e.g., polished or brushed) to provide an aesthetically pleasing design. In some embodiments, electronic device 200 may also include clip 252, which may be operative to ground several components of the electronic device. For example, clip 252 may be operative to ground bezel 230, circuit board 242, and housing 260, as described in more detail below.

Bezel 230 may be constructed from any suitable material and using any suitable approach. For example, bezel 230 may be constructed from a metal (e.g., steel, aluminum, or titanium), a composite material, plastic, or any other suitable material. In one particular implementation, bezel 230 may be constructed from aluminum and housing 260 may be formed from steel. In some embodiments, bezel 230 may be at least partially constructed using a forging process. For example, 60% of the final shape of bezel 230 may be achieved using a forging process, and the remaining 40% may be achieved using a machining process.

A forging process may include, for example, shaping metal using localized compressive forces. The forging process may be done at any temperature, including at room temperature or near room temperature (e.g., cold forging), at a high temperature, which makes metal easier to shape and less likely to fracture (e.g., hot forging), or at intermediate temperature between room temperature and hot forging temperatures (e.g., warm forging). Using a forging process, the thickness of the material may be controlled at different points along a surface (e.g., unlike stamping). For example, a shape may be formed using a series of presses, each press having a different shape, thus allowing for complex geometries (e.g., defined by the different presses) while providing structure and variation in wall thickness (e.g., unlike using a die cast). Forging may also provide a smooth surface, which can eliminate the need for additional finishing processes (e.g., unlike machining).

Figure 3:
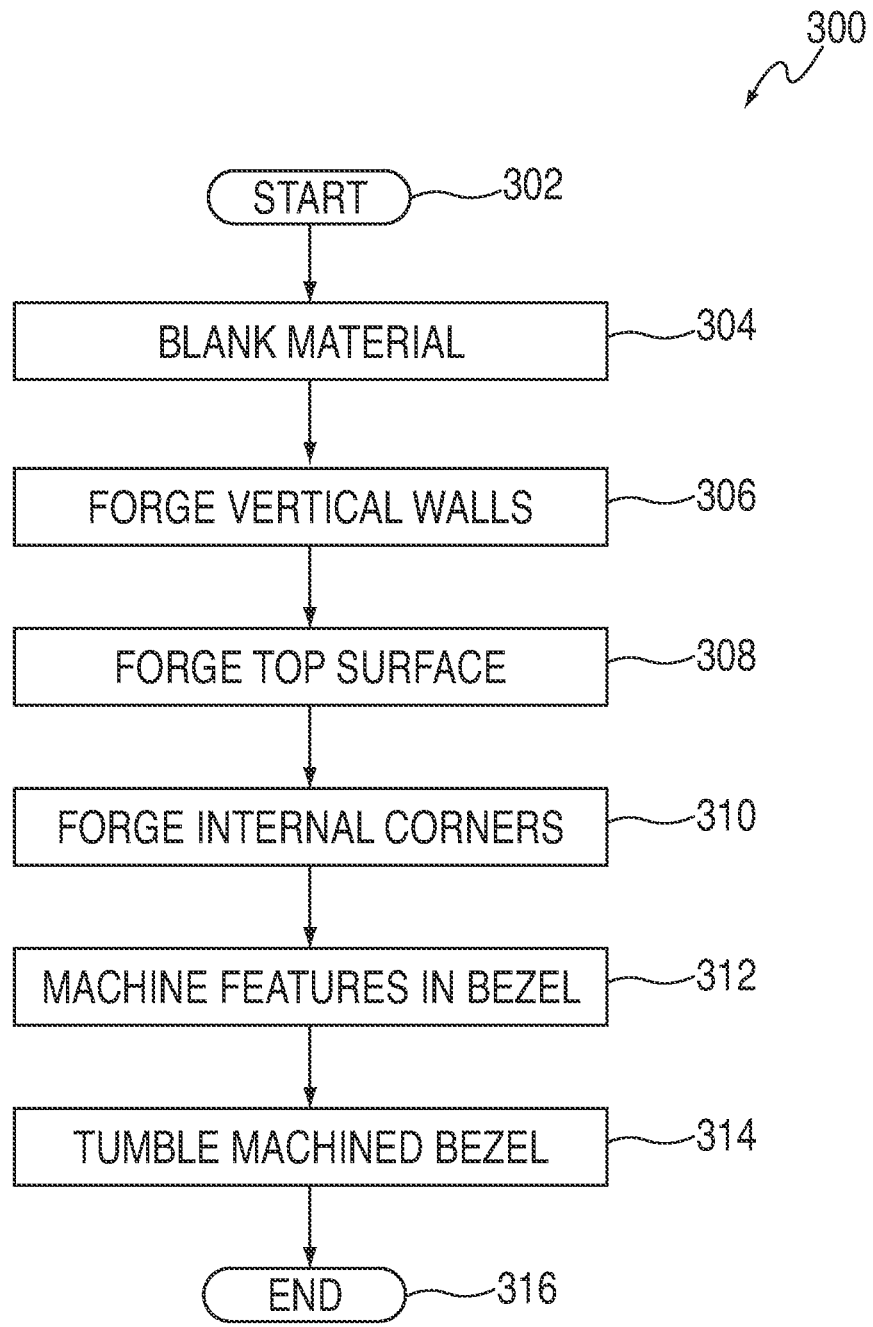
FIG. 3 is a flow chart of an illustrative process for forging a bezel of an electronic device case in accordance with one embodiment of the invention.

FIG. 3 is a flow chart of an illustrative process for forging a bezel of an electronic device case in accordance with one embodiment of the invention. Process 300 may begin at step 302. At step 304, the material used to create the bezel may be blanked. For example, a piece of stock aluminum or steel may be stamped or punched out (e.g., blank a piece of aluminum from which the bezel will be formed). The blanked material may have initial dimensions that exceed the final dimensions of the bezel. The initial material may have any suitable thickness, including for example a thickness in the range of 0.5 to 4.5 mm (e.g., 2.5 mm). At step 306, vertical walls may be forged in the blanked material (e.g., vertical wall 132, FIG. 1). For example, the material may be placed in a die and forged to push vertical walls of the bezel inward to reduce the height of the walls and to increase the width of the walls.

At step 308, the top surface of the bezel may be forged (e.g., top surface 131, FIG. 1). For example, the material may be placed in a die (e.g., the same die or a different die as in step 306) and forged to shape the curvature of the top surface (e.g., to forge a gradual shape with a gentle curve). At step 310, the internal corners and other internal features of the bezel may be forged. For example, the material may be placed in a die and forged with a higher pressure than at step 306 to forge the internal corners and features of the bezel. Each of steps 306, 308 and 310 may be repeated as necessary with different dies and different forging pressures until the shape of the bezel matches the desired final shape.

At step 312, the features that cannot be manufactured using forging may be machined in the bezel. For example, the holes for the window (e.g., window 110, FIG. 1) and the input mechanism (e.g., input mechanism 120, FIG. 1) may be machined. As another example, the undercuts in the bezel wall (e.g., snaps 434, FIG. 4) may be machined from the forged bezel. As still another example, screw holes for coupling electronic device components to the bezel may be tapped. At step 314, the machined bezel may be tumbled to polish the surface of the bezel. The bezel may be tumbled with any suitable material (e.g., ceramic balls or walnut shells) at any suitable speed to polish the surface of the bezel. Process 300 may then end at step 316.

Figure 4:
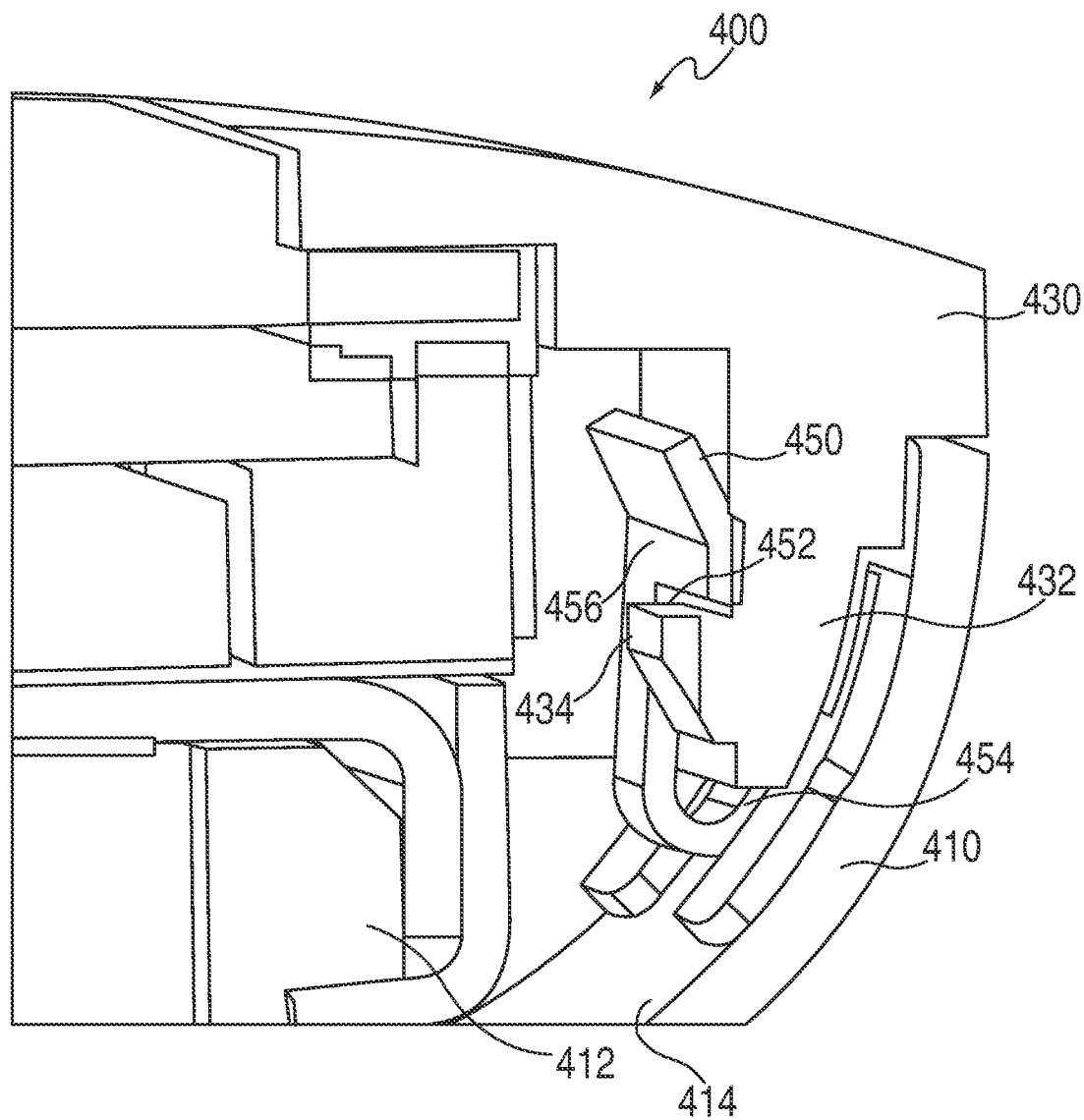
FIG. 4 is cross-sectional view of an assembled case in accordance with one embodiment of the invention.

To assemble the electronic device, the bezel may include a snap operative to engage a component coupled to the housing. FIG. 4 is cross-sectional view of an assembled electronic device in accordance with one embodiment of the invention. Electronic device 400 may include housing 410 and bezel 430. Bezel 430 may engage housing 410 using snap 434 extending from post 432. In some embodiments, the position and orientation of post 432 and snap 434 may be constrained by the shape and dimensions of electronic device 400. For example, housing 410 may have any suitable curvature 412, including for example a large radius or spline, thus providing a longer curved back surface for electronic device 400. In addition, electronic device 400 may be thin (e.g., 6.5 mm). The combination of the curvature of housing 410 and the thickness of electronic device 400 may limit the space available between wall or post 432 and inner surface 414 of housing 410 when electronic device 400 is assembled. To accommodate the reduced space, snap 434 of bezel 430 may not extend out towards inner surface 414, but may instead extend in away from inner surface 414.

Electronic device 400 may include spring 450 operative to engage snap 434 when electronic device 400 is assembled. Spring 450 may be any suitable spring type, including for example a cantilever spring. Spring 450 may be formed from any suitable material that allows spring 450 to be elastically deformed when bezel 430 is inserted into housing 410 (e.g., to accommodate for snap 434 as it passes into aperture 452). For example, spring 450 may be formed from a material with a high modulus of elasticity, such as metal (e.g., aluminum or steel), plastic, a composite material, or any other suitable material. In some embodiments, spring 450 may include at least one portion that is responsive to a magnetic force in the presence of a magnetic field (e.g., to release bezel 430 when a magnet is approached to electronic device 400).

Spring 450 may have any suitable shape. In some embodiments, spring 450 may have a U-shaped or J-shaped cross-section defining a channel in which post 432 may extend when electronic device 400 is assembled. Outer wall 454 of spring 450 may be coupled to housing 410, and inner wall 456 of spring 450 may extend away from inner surface 414 of housing 410 such that post 432 may extend between outer wall 454 and inner wall 456. Outer wall 454 may be coupled to housing 410 using any suitable approach. For example, spring 450 may be mechanically coupled to housing 410 (e.g., using one or more snaps and apertures), coupled using hook and loop material (e.g., Velcro®), an adhesive, or any other suitable approach. In some embodiments, outer wall 454 of spring 450 may be welded to inner surface 414 of housing 410 (e.g., if at least a portion of spring 450 is metallic and may be welded).

Inner wall 456 may include aperture 452 operative to receive snap 434 when bezel 430 engages spring 450. Aperture 452 may include any suitable feature for receiving and engaging snap 434. For example, aperture 452 and snap 434 may include opposing features (e.g., flat surfaces operative to press against each other) operative to maintain bezel 430 engaged with spring 450. As another example, snap 434 may extend beyond the outer edge of spring 450 to more securely engage aperture 452.

By including snaps 434 that extend into electronic device 400, bezel 430 may engage housing 410 more securely than if snaps 434 extended towards inner surface 414 of housing 410. For example, during a drop event or when electronic device 400 receives an impact (e.g., housing 410 of electronic device 400 is hit), a force may be applied to post 432 that causes post 432 to move away from inner surface 414 and towards inner wall 456 of spring 450. By moving towards inner wall 456, snap 434 further engages aperture 452 and reduces the chance that bezel 430 will disengage spring 450 and housing 410 during a drop event. If snap 434 instead were to extend towards inner surface 414 and engage spring 450 between post 432 and housing 410, a drop event would cause post 432 and snap 434 to move away from spring 450 and aperture 452, thus increasing the chance that bezel 430 disengages housing 410.

Figure 5:
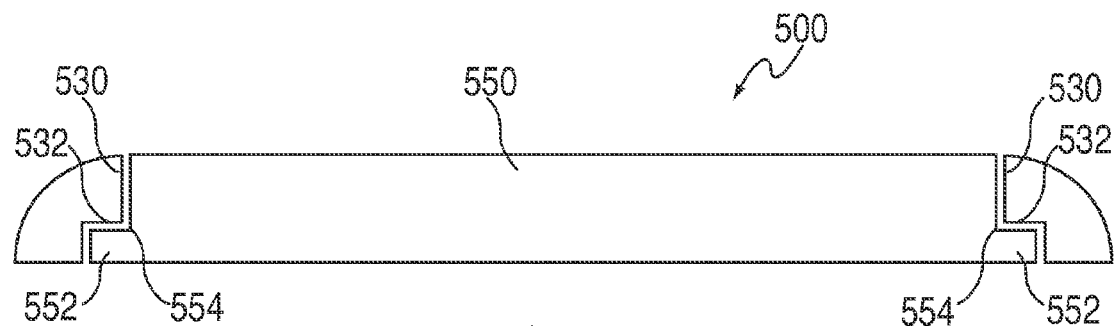
FIG. 5 is a cross-sectional view of a window mounted in a case in accordance with one embodiment of the invention.

The electronic device of the invention may include a window for providing displays to the user. The window may be formed from any suitable material, including for example plastic (e.g., polymethyl methacrylate, or PMMA) or glass, and may be mounted within the case using any suitable approach. FIG. 5 is a cross-sectional view of a window mounted in a case in accordance with one embodiment of the invention. Electronic device 500 may include bezel 530 and window 550. Window 550 may include flange 552 operative to fit below lip 532 of bezel 530 to mount window 550 in the case. When electronic device 500 is assembled, window 550 may be held in place by the contact between lip 532 and flange 552. In some embodiments, lip 532 and flange 552 may be coupled using any suitable approach, including for example an adhesive, a gasket (e.g., in a press-fit), a fastener (e.g., one or more screws), or any other suitable approach.

Because of flange 552, window 550 may experience significant stresses at point 554, where flange 552 initially extends beyond the displayed portion of window 550. In some embodiments, the stresses may be so significant as to prevent window 550 from being constructed from brittle materials, such as glass. Instead, it may be necessary to construct window 550 with flange 552 from plastic (e.g., PMMA). For example, flange 552 may be machined into a piece of PMMA. Because glass may have better optical properties and better abrasion resistance than PMMA, however, it may be desirable to provide a glass window with a flange for mounting to the bezel.

Figure 6:
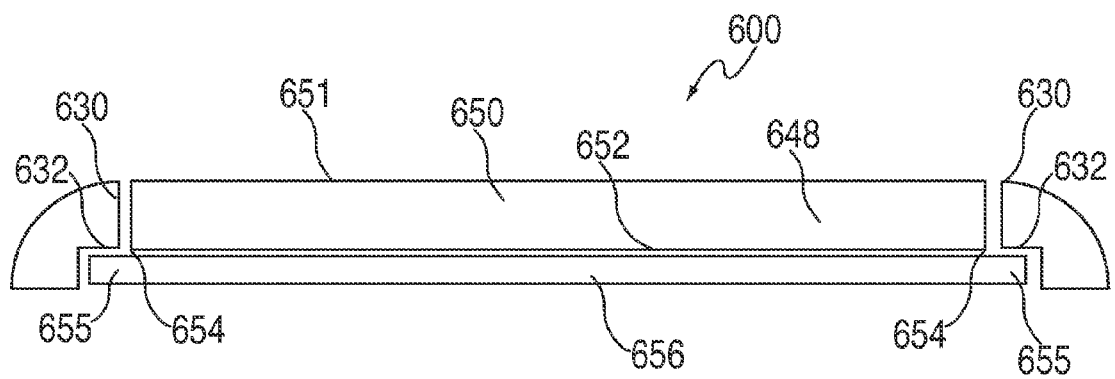
FIG. 6 is a cross-sectional view of another window mounted in a case in accordance with one embodiment of the invention.
Figure 7:
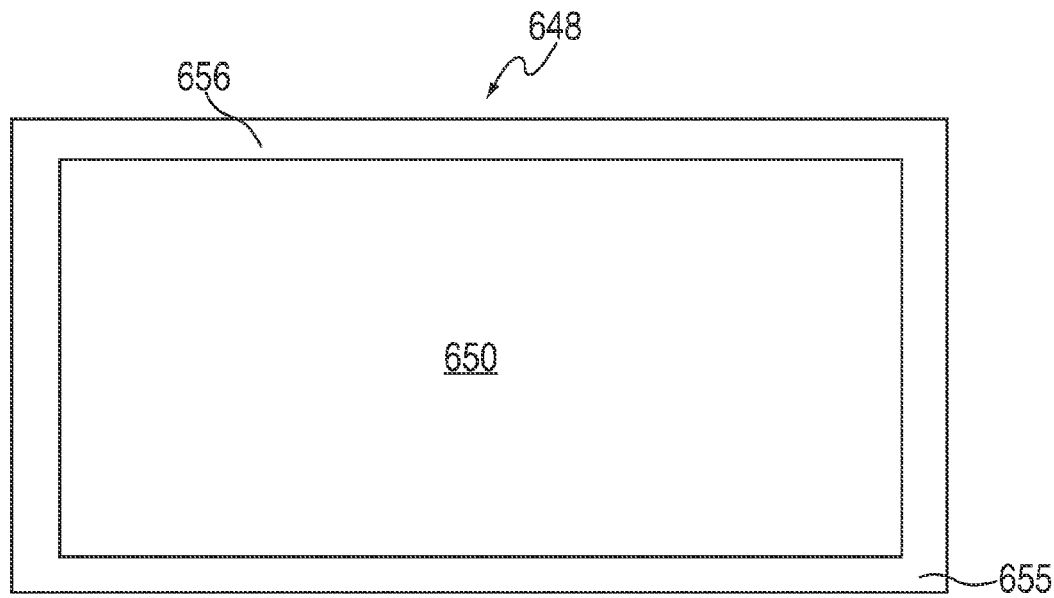
FIG. 7 is a top view of the display of FIG. 6 in accordance with one embodiment of the invention.

FIG. 6 is a cross-sectional view of another window mounted in a case in accordance with one embodiment of the invention. Electronic device 600 may include bezel 630 and window 648. As with electronic device 500 (FIG. 5), bezel 630 may include lip 632 under which a portion of window 648 may fit to mount display 650 to bezel 630. Window 648 may include an outer layer 650 and inner layer 656. Outer layer 650 may include outer surface 651 that is exposed to the user of electronic device 600, and inner surface 652 which may be coupled to inner layer 656. Inner layer 656 may be larger than outer layer 650 such that flanges 655 of inner layer 656 extend beyond the edge of outer layer 650. FIG. 7 is a top view of the display of FIG. 6 in accordance with one embodiment of the invention. As shown in FIG. 7, window 648 may include outer layer 650 and inner layer 656. Outer layer 650 may be smaller than inner layer 656 such that a portion of inner layer 656 extends beyond outer layer 650, forming flange 655. Flange 655 may be operative to fit against lip 632 when window 648 is mounted in bezel 630. In some embodiments, flange 655 may extend entirely around the edge of outer layer 650, or only around portions of the edge of outer layer 650 (e.g., only around the top and bottom, only around the sides, only around the corners, or in sections around one or more sides or corners). By constructing window 648 from two distinct pieces, the stresses at point 654 (i.e., where flange 655 begins and meets lip 632), are not as high in outer layer 650 and thus reduce the risk of outer layer 650 breaking.

Outer layer 650 and inner layer 656 may be coupled using any suitable approach, including for example an adhesive placed between outer layer 650 and inner layer 656, or any other suitable approach. In some embodiments, outer layer 650 and inner layer 656 may be coupled in an manner that does not affect images created by optical components located underneath inner layer 656 (e.g., such that displays are generated underneath inner layer 656, and pass through inner layer 656 and the coupling mechanism before being displayed in outer layer 650. In some embodiments, inner layer 656 may include one or more apertures through which generated displays may be projected. For example, inner layer 656 may only be placed around the border of outer layer 650 such that the entire center of outer layer 650 is unobstructed. By maintaining inner layer 656 around the border of outer layer 650, window 648 may still be coupled to bezel 630 using flanges 655. A more detailed description of an approach for coupling outer layer 650 and inner layer 656 may be found in commonly owned U.S. Pat. No. 7,966,785, issued on Jun. 28, 2011, incorporated herein in its entirety. In some embodiments, outer layer 650 may be constructed from glass to provide scratch resistance and high quality optical displays, and inner layer 656 may be constructed from PMMA or another plastic to provide resistance to the stresses caused by mounting window 648 to bezel 630.

Window 648 may be coupled to bezel 630 using any suitable approach. In some embodiments, only inner layer 656 may be coupled to bezel 630, for example by coupling flange 655 to lip 632 using an adhesive, a gasket (e.g., in a press-fit), a fastener (e.g., one or more screws), or any other suitable approach. In some embodiments, outer layer 650 and inner layer 656 may both be coupled to bezel 630, for example by coupling flange 655 to lip 632 (e.g., using an approach described above) and coupling outer layer 650 to the sides of bezel 630 (e.g., using an adhesive, or a gasket in a press-fit).

Figure 8:
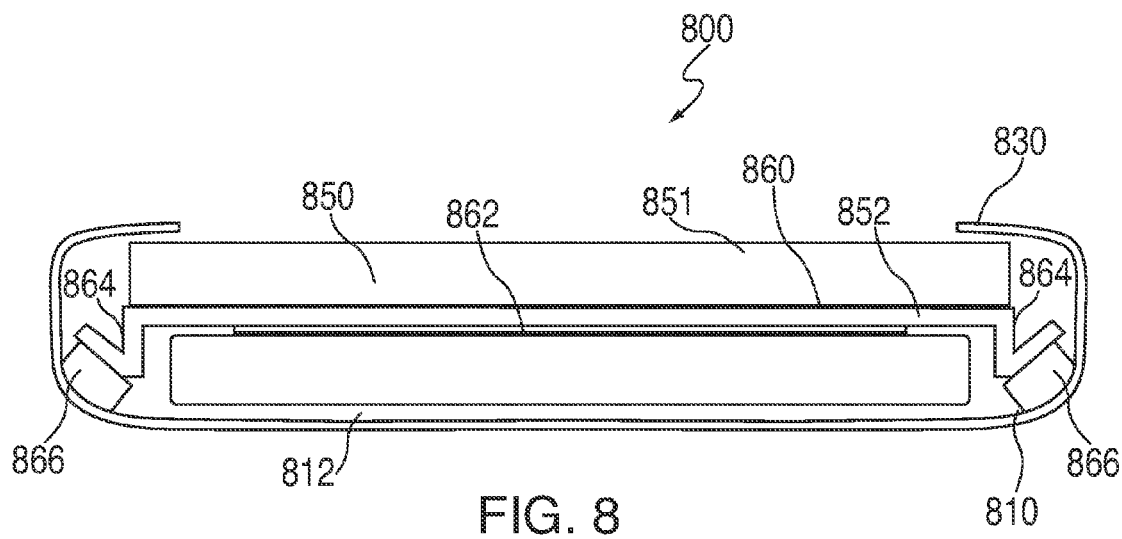
FIG. 8 is a cross-sectional view of a mechanism for supporting a window in a case in accordance with one embodiment of the invention

In some embodiments, in addition to supporting the window using flanges 655 coupled to bezel 630, the electronic device may include an additional mechanism for supporting the window. FIG. 8 is a cross-sectional view of a mechanism for supporting a window in an electronic device in accordance with one embodiment of the invention. Electronic device 800 may include housing 810, bezel 830, and window 850. Window 850 may be supported around its perimeter by flanges coupled to bezel 830 and by a supporting mechanism placed in contact with inner surface 852 of window 850.

One approach for supporting inner surface 852 of window 850 may be to provide a solid support between inner surface 852 and inner surface 812 of housing 810. Such an approach, however, may lead to significant lost space between window 850 and housing 810. To avoid losing the space between window 850 and housing 810 while providing support to inner surface 852 of window 850, the electronic device may include chassis 860 operative to support window 850 while maintaining space available for additional components between chassis 860 and housing 810.

Chassis 860 may include plate 862 and posts 864. Plate 862 may be operative to support some, all, or substantially all of inner surface 852 of window 850 to prevent window 850 from bending in response to forces applied to outer surface 851 (e.g., due to an impact, or from a user's finger). In some embodiments, plate 862 may be operative to support additional components of the electronic device (e.g., a circuit board). Plate 862 may therefore have any suitable shape, including a shape that substantially matches the shape of window 850. Plate 862 may have any suitable stiffness, including for example a high stiffness against bending. Plate 862 may be formed from any material with having a suitable stiffness, including for example a metal, a plastic, or a composite material. In some embodiments, plate 862 may be coupled to window 850 to further increase the window's resistance to bending (e.g., using an adhesive).

In some embodiments, plate 862 may be positioned between optical components providing displays to window 850. To avoid interfering with the generated displays, plate 862 may be formed from a clear material, or may include one or more apertures through which the generated displays may pass. In some embodiments, plate 862 may instead support both the optical components generating the displays and window 850. In such embodiments, plate 862 may be constructed from any suitable material without accounting for optical considerations.

Plate 862 may be held a distance from inner surface 812 of housing 810 by posts 864. Chassis 860 may include any suitable number of posts 864, and any suitable shape for posts 864. For example, chassis 860 may include several discreet posts around portions of plate 862 (e.g., at the corners of plate 862). As another example, chassis 860 may include one or more discreet or elongated posts 864 along two or more specific portions of plate 862 (e.g., chassis 860 may include four posts 864 forming walls around the periphery plate 862). Posts 864 may be constructed from any suitable stiff material operative to resist buckling due to forces exerted on window 850 and transmitted by plate 862. In some embodiments, posts 864 may be less stiff than plate 862 such that, in the event that a large force is applied to window 850, posts 864 bend before plate 862 buckles and window 850 bends (and possibly cracks, for example if window 850 is glass). In some embodiments, electronic device 800 may include one or more electronic device components between plate 862 and housing 810 (e.g., a battery).

Posts 864 may be coupled to inner surface 812 of housing 810 using any suitable approach. In some embodiments, posts 864 may be directly coupled to inner surface 812. For example, posts 864 may be coupled to housing 810 using an adhesive, a fastener (e.g., a screw), hook and fastener material (e.g., Velcro), mechanical features of the posts and housing (e.g., male and female counterpart elements), or any other suitable approach. In some embodiments, a portion of each post 864 (e.g., the bottom portion) may be less stiff than the rest of post 864 to elastically absorb smaller (and more frequent) impacts on window 850 without affecting the structural integrity of the remaining portions of posts 864 and plate 862.

Figure 9:
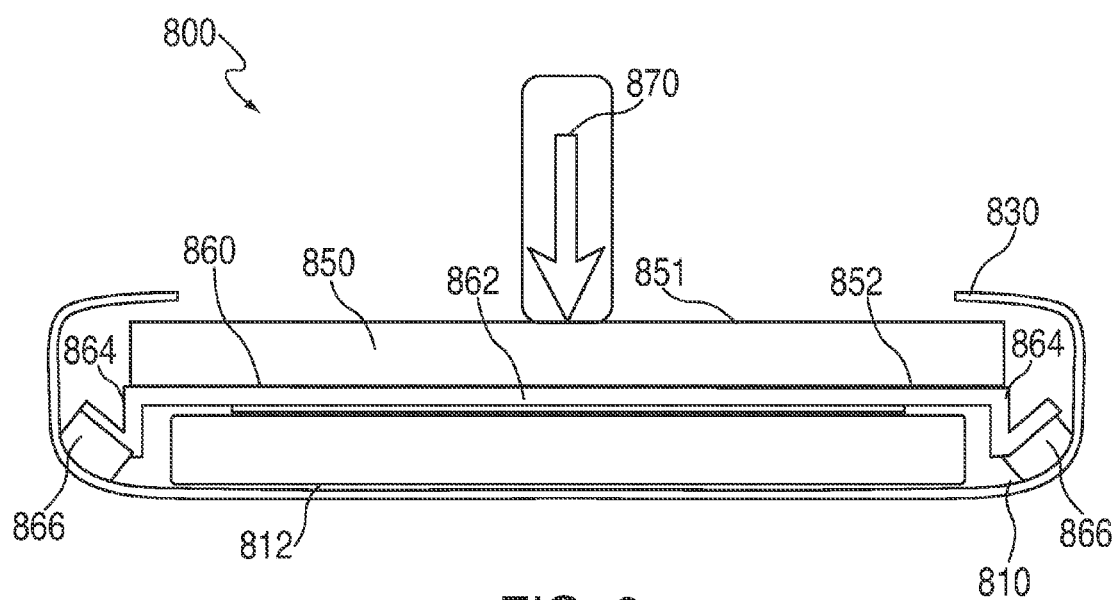
FIG. 9 is a cross-sectional view of the mechanism for supporting a window in the case of FIG. 8 when a force is applied to the mechanism in accordance with one embodiment of the invention.

In some embodiments, posts 864 may be coupled to housing 810 by the intermediary of compliant material 866. Compliant material 866 may be operative to deform in response to forces applied to window 850 so that chassis 860 may not deform. FIG. 9 is a cross-sectional view of the mechanism for supporting a window in the case of FIG. 8 when a force is applied to the mechanism in accordance with one embodiment of the invention. When force 870 is applied to window 850 (e.g., a user presses on window 850 with a finger), window 850 and chassis 860 may rigidly be displaced to transfer force 870 to compliant material 866, which may in turn deform to accommodate force 870. Compliant material 866 may be selected and constructed such that, in its deformed state, plate 862 does not apply pressure to electronic device components located between housing 810 and chassis 860.

Compliant material 866 may be constructed from any suitable material. For example, compliant material 866 may be constructed from a soft plastic, synthetic material, foam, sponge, or any other suitable material. Compliant material 866 may be placed at the end of some or all of posts 864. In some embodiments, compliant material 866 may be placed between posts 864 (e.g., as a strip of a foam that follows the edge of plate 862 if chassis 860 includes several distinct posts 864).

Figure 10:
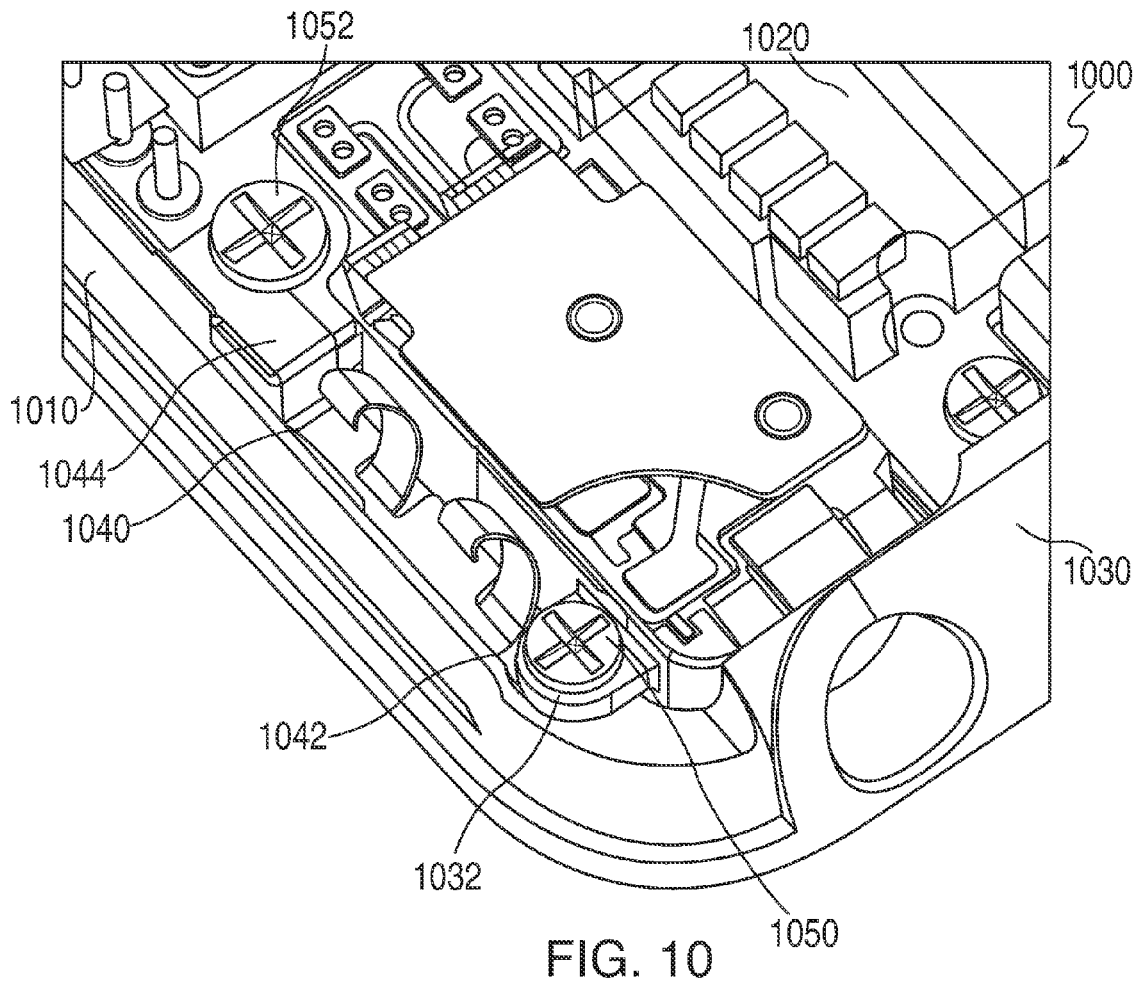
FIG. 10 is a schematic view of a grounding clip for use in an electronic device case in accordance with one embodiment of the invention.
Figure 11:
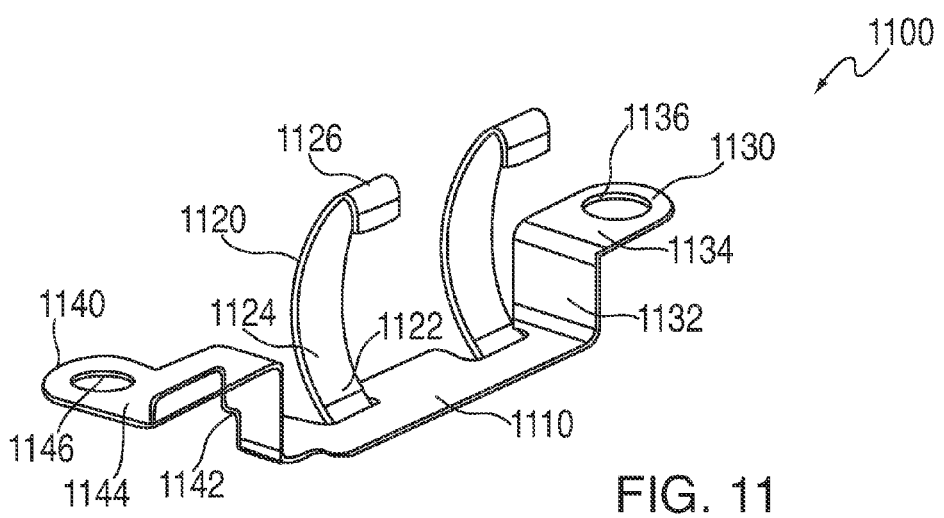
FIG. 11 is a schematic view of a grounding clip in accordance with one embodiment of the invention.

The electronic device components placed within the case may be grounded using any suitable approach. In some embodiments, several grounding components may be used to ground each of the electronic device components of the electronic device (e.g., a circuit board, a bezel, a housing, and a gimbal plate for an input mechanism). In other embodiments, a single grounding component may be used for all of the electronic device components, which may allow for a compact component that is easy to manufacture. FIG. 10 is a schematic view of a grounding clip for use in an electronic device case in accordance with one embodiment of the invention. Electronic device 1000 may include housing 1010, bezel 1030, circuit board 1035 and grounding clip 1040. Clip 1040 may include a number of portions operative to contact each of housing 1010, bezel 1030, circuit board 1035, and fasteners 1050 and 1052, including platforms 1042 and 1044. For example, fastener 1050 may couple platform 1042 to bezel 1030 and fastener 1052 may couple platform 1044 to circuit board 1035. FIG. 11 is a schematic view of a grounding clip in accordance with one embodiment of the invention. Grounding clip 1100 may include base 1110. Base 1110 may provide a platform from which different components of clip 1100 extend to come into contact with electronic device components (e.g., components identified in FIG. 10).

Clip 1100 may include one or more springs 1120 operative to contact the case housing (e.g., housing 1010, FIG. 10) when clip 1100 is mounted in the case. Springs 1120 may be any suitable type of spring, including for example a leaf spring, helical spring, spiral spring, cantilever spring, or any other suitable spring. In the example of FIG. 11, spring 1120 may include a cantilever spring coupled to base 1110 along line 1122. Spring 1120 may include curved strip 1124 that extends from base 1110 towards the ultimate position of the case housing. The length of strip 1124 may be selected such that tip 1126 of strip 1124 is in contact with the housing when clip 1100 is mounted in the case and strip 1124 is forced to bend elastically to accommodate the proximity of the housing, as described in more detail in FIG. 12.

Clip 1100 may include first connector 1130 operative to couple clip 1100 to the bezel (e.g., bezel 1030, FIG. 10). Connector 1130 may include platform 1134, which may be in a different plane than base 1110, and connected to base 1110 via wall 1132. In some embodiments, platform 1134 may be co-planar or substantially co-planar with base 1110, and wall 1132 may be orthogonal to or substantially orthogonal to at least one of base 1110 and platform 1134. Wall 1132 may be at a first end of base 1110 such that, as seen from the top, platform 1134 appears to extend base 1110. In some embodiments, base 1110, wall 1132 and platform 1134 may have substantially the same width, or platform 1134 may be tapered to accommodate the bezel.

Platform 1134 may be coupled to the bezel using any suitable approach. For example, platform 1134 may be coupled to the bezel by welding, soldering, a mechanical fastener (e.g., a screw), tape, an adhesive, or any other suitable approach that maintains the electrical connectivity between platform 1134 and the bezel. In some embodiments, platform 1134 may include hole 1136 operative to receive a mechanical fastener (e.g., a screw). As shown in FIG. 10, platform 1042 may be placed below protrusion 1032 of bezel 1030. To maintain platform 1042 in contact with protrusion 1032 to ground bezel 1030, fastener 1050 may be passed through protrusion 1032 and platform 1042 (e.g., through hole 1136, FIG. 11). In some embodiments, fastener 1050 may be constructed from an electrically conductive material to enhance the transfer of current from platform 1042 to protrusion 1032 (e.g., a copper screw).

Clip 1100 may include second connector 1140 operative to couple clip 1100 to the circuit board (e.g., circuit board 1035, FIG. 10). Connector 1140 may include platform 1144, which may be in a different plane than base 1110, and connected to base 1110 via wall 1142. In some embodiments, platform 1144 may be co-planar or substantially co-planar with base 1110, and wall 1142 may be orthogonal to or substantially orthogonal to at least one of base 1110 and platform 1144. Wall 1142 may be at a first end of base 1110 such that, as seen from the top, platform 1144 appears to extend base 1110. In some embodiments, base 1110, wall 1142 and platform 1144 may have substantially the same width, or platform 1144 may be tapered to accommodate the bezel.

Platform 1144 may be coupled to the bezel using any suitable approach. For example, platform 1144 may be coupled to the bezel by welding, soldering, a mechanical fastener (e.g., a screw), tape, an adhesive, or any other suitable approach that maintains the electrical connectivity between platform 1144 and the bezel. In some embodiments, platform 1144 may include hole 1146 operative to receive a mechanical fastener (e.g., a screw). As shown in FIG. 10, platform 1044 may be placed above circuit board 1035. To maintain platform 1044 in contact with circuit board 1035, fastener 1052 may be passed through circuit board 1035 and platform 1044 (e.g., through hole 1146, FIG. 11). In some embodiments, fastener 1052 may be constructed from an electrically conductive material to enhance the transfer of current from platform 1044 to circuit board 1035 (e.g., a copper screw).

Figure 12:
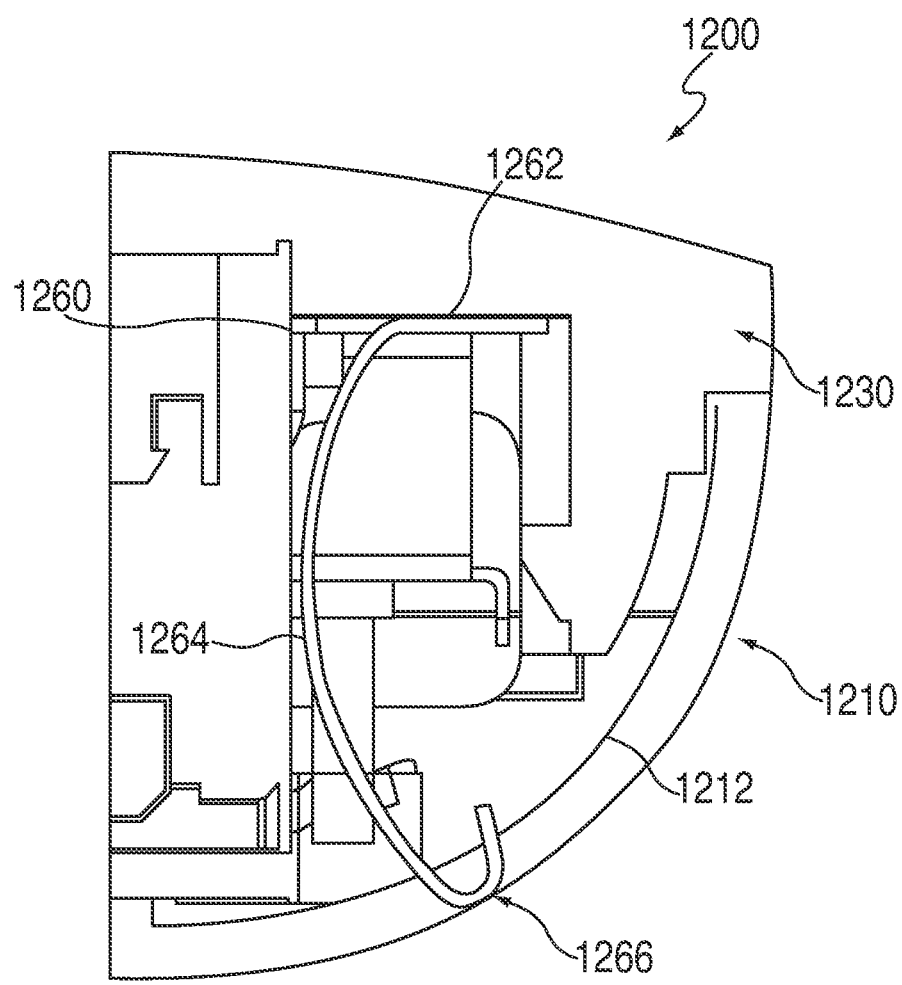
FIG. 12 is a cross-sectional view of a clip mounted in a case in accordance with one embodiment of the invention.

FIG. 12 is a cross-sectional view of a clip such as the clip of FIG. 11 mounted in an electronic device in accordance with one embodiment of the invention. Electronic device 1200 may include housing 1210 and bezel 1230. Clip 1260 may include some or all of the features of clip 1100 (FIG. 11). Clip 1260 may be placed within electronic device 1200 such that strip 1264 extends away from base 1262 towards housing 1210. As shown in FIG. 12, strip 1264 may be constructed such that it is longer than necessary to reach inner surface 1212 of housing 1210 (e.g., tip 1266 of strip 1264 extends beyond inner surface 1212). When assembled, strip 1264 may be forced to bend such that tip 1266 remains in contact with inner surface 1212 (e.g., and does not pass through housing 1210). The elastic deformation of strip 1264 caused by forcing strip 1264 to bend create an opposing may maintain clip 1260 in contact with housing 1210, and thus continue to ground housing 1210 in the event of impacts or other events that could cause strip 1264 to be displaced.

Clip 1100 (and clip 1260) may be formed from any material suitable from grounding electronic device components. For example, clip 1100 may be formed from a metal, a semiconductor, a composite material, or any other suitable material with sufficient electrical conductivity. In some embodiments, clip 1100 may be copper having a thickness of substantially 0.1 mm. Clip 1100 may be manufactured using any suitable approach, including for example forging, molding, casting, forming, stamping, machining, combinations of these, or any other suitable approach. In some embodiments, additional operations may be performed on clip 1100 once the shape of clip 1100 has been set to improve electrical conductivity or to make clip 1100 more aesthetically pleasing (e.g., a polishing process or a plating process).

The electronic device case may have a number of input mechanisms. In some embodiments, the electronic device case may include a hold switch (e.g., hold switch 140, FIG. 1B). The hold switch may be operative to disable another input mechanism (e.g., input mechanism 120, FIG. 1A) to avoid undesired inputs, for example when the electronic device is in a user's pocket. When the user wishes to provide an input using the other input mechanism, the user may move the hold switch from its initial position (e.g., "hold") to a second position (e.g., "active").

Figure 13:
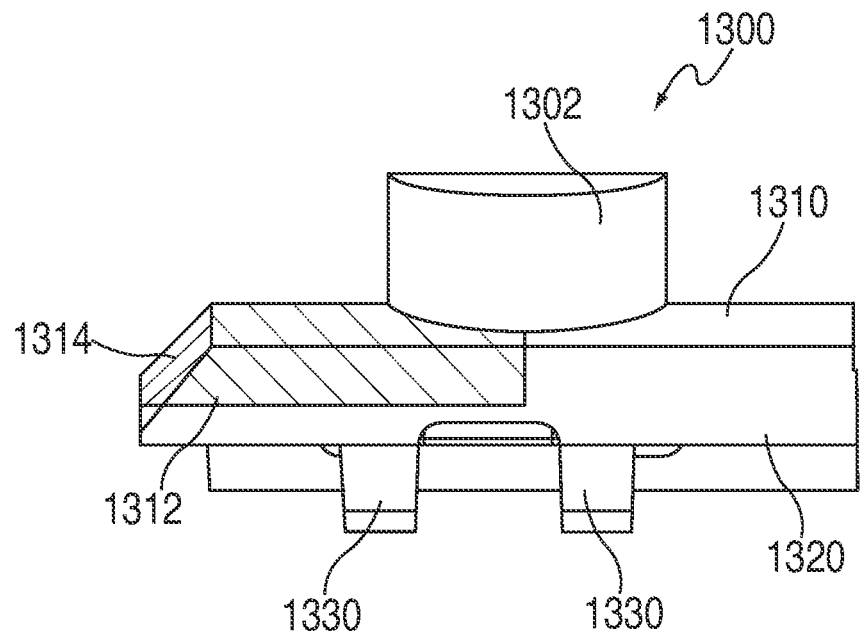
FIG. 13 is a side view of a hold switch in accordance with one embodiment of the invention.
Figure 14:
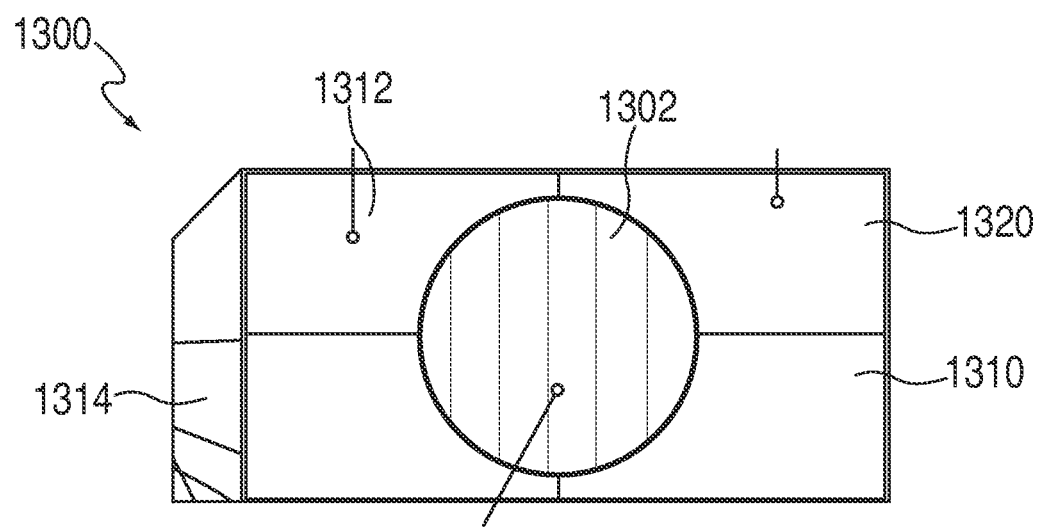
FIG. 14 is a top view of a hold switch in accordance with one embodiment of the invention.

FIG. 13 is a side view of a hold switch in accordance with one embodiment of the invention, and FIG. 14 is a top view of a hold switch in accordance with one embodiment of the invention. Switch 1300 may include button 1302 that is captured by base 1310. Button 1302 may be any suitable button for extending beyond the outer surface of base 1310 (e.g., for extending into a channel of the bezel which base 1310 remains under the surface of the bezel). Button 1302 may be constructed from any suitable material, including for example, plastic, composite materials, metal (e.g., aluminum), ceramics, or any other suitable material. In some embodiments, button 1302 and base 1310 may be constructed from different materials (e.g., for aesthetic purposes, or to more clearly differentiate button 1302 from base 1310). Button 1302 may have any suitable shape, including for example cylindrical.

Button 1302 may be captured by base 1310 using any suitable approach. For example, base 1310 may include an opening into which button 1302 is press fit. As another example, button 1302 may be coupled to base 1310 (e.g., using an adhesive, tape, or a mechanical fastener). As still another example, button 1302 may be molded into base 1310 during the manufacturing process. Base 1310 may include first portion 1312 manufactured from a first color (e.g., orange), and second portion 1320 manufactured from a second color (e.g., white). When switch 1310 is in a first position, only first portion 1312 and button 1302 may be visible through the bezel, indicating to the user that switch 1310 is in its first position (e.g., indicating that the click-wheel is locked). When switch 1310 is in a second position, only second portion 1320 and button 1302 may be visible through the bezel, indicating to the user that switch 1310 is in its second position (e.g., indicating that the click-wheel is unlocked).

To manufacture base 1310 from materials having two colors (e.g., from two different materials), base 1310 may be constructed using a double shot process. First, first portion 1312 may be molded using a first material (e.g., a first plastic having a first color). In some embodiments, button 1302 may begin to be molded into first portion 1312 to form switch 1300. Once first portion 1312 has been molded, second portion 1320 may be molded around first portion 1312 such that first portion 1312 is captured by the material forming second portion 1320 (e.g., a second plastic having a second color). Button 1302 may be completely captured by base 1310 when second portion 1320 is molded around first portion 1312. In some embodiments, second portion 1320 may be molded before first portion 1312.

Figure 15:
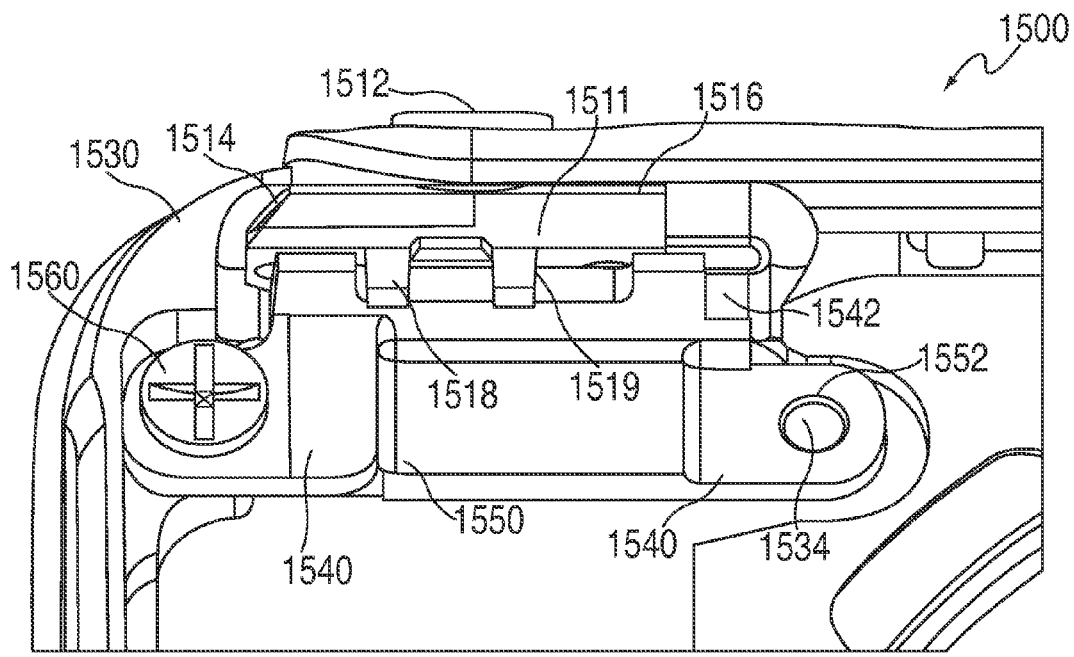
FIG. 15 is a schematic view of a hold switch mounted in an electronic device case in accordance with one embodiment of the invention.

First portion 1312 may be defined, at the end opposite button 1302, by curved surface 1314. Curved surface 1314 may be defined by a spline 1316. In some embodiments, curved surface 1314 may be constructed to match the curvature of the inner surface of the bezel, against which the second portion may abut when switch 1300 is moved. In some embodiments, the top surfaces of first portion 1312 and second portion 1320 may be curved surfaces, where the curvature of the surfaces is defined by a spline. The spline may be selected to match the curvature of the inner surface of the bezel under which switch 1300 is placed (e.g., as shown in FIG. 15).

Base 1310 may include prongs 1330 and 1332 extending from base 1310 away from button 1302 (e.g., hidden from the user's view). Prongs 1330 and 1332 may be operative to engage a mechanism with the electronic device to change the state of the electronic device when switch 1300, and thus prongs 1330 and 1332 are displaced. For example, a mechanism may be placed between prongs 1330 and 1332 such that, as switch 1300 moves, one of prongs 1330 and 1332 may move the mechanism to follow the movement of switch 1300.

Figure 16:
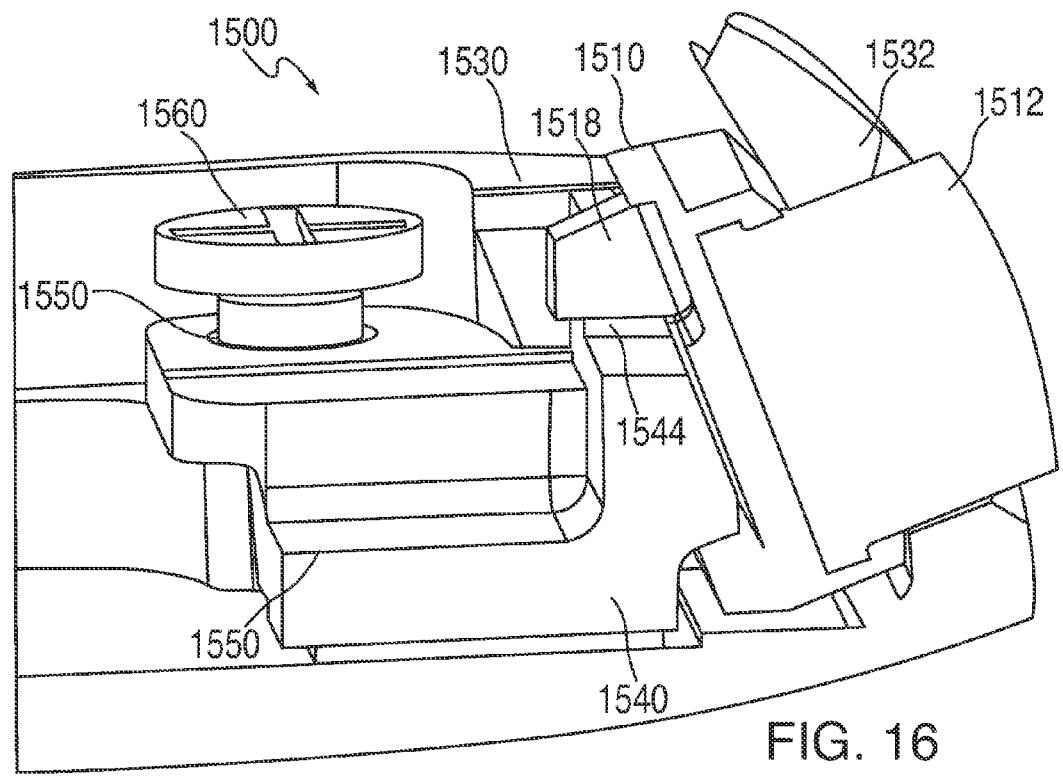
FIG. 16 is another schematic view of the switch of FIG. 15 mounted in an electronic device in accordance with one embodiment of the invention.

Switch 1300 may be held in position in the bezel using any suitable approach. FIG. 15 is a schematic view of a hold switch mounted in an electronic device case in accordance with one embodiment of the invention. FIG. 16 is another schematic view of the switch of FIG. 15 mounted in an electronic device in accordance with one embodiment of the invention. Case 1500 may include bezel 1530, which may include channel 1532 through which button 1512 of switch 1510 may extend. Channel 1532 may be constructed such that the width of channel 1532 is substantially that of button 1512, and the length of channel 1532 is substantially that of one of first portion 1514 and second portion 1516 (e.g., such that only one of first portion 1514 and second portion 1516 are visible through channel 1532 when switch 1510 moves). Button 1512 may be constructed such that button 1512 partially extends beyond the outer surface of bezel 1530 (e.g., so that the user may actuate switch 1510 by moving button 1512).

Switch 1510 may be held in channel 1532 using any suitable approach. In some embodiments, switch 1510 may be held in position by bracket 1540, and may be biased forward (e.g., into channel 1532). Bracket 1540 may include protrusion 1542 operative to support switch 1510. For example, the lower surface of base 1511 may rest on protrusion 1542, thus holding switch 1510 between bezel 1530 and bracket 1540. By supporting substantially the entire length of switch 1510 with a protrusion 1542, forces applied to switch 1510 may be distributed to bezel 1530 and may reduce the risk that switch 1510 or bracket 1540 fails. Protrusion 1542 may include slot 1544 for receiving prongs 1518 and 1519 of switch 1510. The length of slot 1544 may be selected such that one of prongs 1518 and 1519 abuts against the end of slot 1544 when button 1512 abuts against one of the ends of channel 1532.

Bracket 1540 may be mounted to bezel 1530 using any suitable approach. In some embodiments, bracket 1540 may include support 1550 from which protrusion 1542 extends. Support 1550 may be placed against the surface of bezel 1530 and coupled to bezel 1530 using any suitable approach. In some embodiments, support 1550 may be coupled to the surface of bezel 1530 using an adhesive, tape, a frictional fit (e.g., a snap fit), a mechanical fastener, or any other suitable approach. In some embodiments, support 1550 may include features on its lower surface operative to match features of the surface of bezel 1530 (e.g., ridges in bezel 1530 are matched with channels in support 1550). In some embodiments, support 1550 may include features to support components of the electronic device (e.g., a circuit board).

In some embodiments, support 1550 may be coupled to bezel 1530 using a pin and slot and a mechanical fastener. Support 1550 may include slot 1552 operative to receive pin 1534 of bezel 1530. Slot 1552 may be located at one end of support 1550 to serve as a first anchor for support 1550. Support 1550 may include hole 1554 at an opposite end of support 1550 for receiving a mechanical fastener (e.g., a screw). By coupling opposite ends of support 1550 to bezel 1530 using slot 1552 and hole 1554, bracket 1540 may be securely coupled to bezel 1530, and thus maintain switch 1510 securely in channel 1532 of bezel 1530.

To mount bracket 1540 in bezel 1530, support 1550 may be placed in bezel 1530 such that pin 1534 extends into slot 1552. Bracket 1540 may then be rotated until hole 1554 is aligned with a corresponding hole in bezel 1530 so that fastener 1560 (e.g., a screw) may be inserted in hole 1554 and the corresponding hole in bezel 1530. By controlling the amount by which bracket 1540 is rotated around pin 1534, the amount by which button 1512 extends out of bezel 1530 may be controlled. In addition, the space made available for switch 1510 to slide between bracket 1540 and bezel 1530 may be controlled by the rotation of bracket 1540, and thus the looseness or tightness of the sliding of switch 1510 may be controlled. By using pin 1532 and slot 1552 at one end of support 1550 (e.g., instead of another fastener) to couple bracket 1540 to bezel 1530, bracket 1540 may retain a low profile and leave more space available in case 1500 for other electronic device components (e.g., a circuit board).

The above described embodiments of the invention are presented for purposes of illustration and not of limitation, and the present invention is limited only by the claims which follow.

What is claimed is:

1. A chassis for supporting a window in an electronic device comprising a housing, the chassis comprising:
   a plate operative to be placed against a back surface of the window, wherein the window rests against a top surface of the plate;
   at least two posts extending from a bottom surface of the plate, wherein each of the at least two posts has a first portion that is less stiff than a second portion and the first portion is operative to elastically absorb impacts on the window; and
   at least one compliant member placed between the at least two posts and the housing of the electronic device case, wherein the at least one compliant member is operative to deform in response to a force applied to the window.

2. The chassis of claim 1, wherein the plate and at least two posts are operative to remain rigid in response to the force applied to the window to distribute the force to the at least one compliant member.

3. The chassis of claim 1, wherein the plate is coupled to the window.

4. The chassis of claim 1, wherein the plate is formed from a clear material.

5. The chassis of claim 1, wherein the plate comprises:
   at least one aperture, wherein a display generated by the electronic device passes through the at least one aperture.

6. The chassis of claim 1, wherein the plate is operative to support an optical component of the electronic device.

7. The chassis of claim 1, wherein the at least two posts are less stiff than the plate.

8. An electronic device, comprising:
   a housing;
   a window comprising a front surface and a back surface;
   a chassis comprising:
     a plate, wherein the back surface of the window rests against a top surface of the plate, wherein the plate comprises at least one aperture and display light generated by the electronic device passes through the at least one aperture; and
     at least two posts extending from a bottom surface of the plate, wherein the at least two posts are coupled to an inner surface of the housing.

9. The electronic device of claim 8, further comprising:
   at least one compliant member placed between the at least two posts and the inner surface of the housing.

10. The electronic device of claim 9, wherein the at least one compliant member is operative to deform in response to a force applied to the window.

11. The electronic device of claim 8, wherein the plate is operative to support a display that produces the display light.

12. The electronic device of claim 8, further comprising:
    a component positioned between the bottom surface of the plate and the inner surface of the housing.

13. The electronic device of claim 12, wherein the component is a battery.

14. The electronic device of claim 12, wherein the component is a circuit board.

* * * * *